US008187698B2

(12) United States Patent
Sundstrom et al.

(10) Patent No.: US 8,187,698 B2
(45) Date of Patent: *May 29, 2012

(54) COATED CUTTING TOOL FOR FINE TO MEDIUM-ROUGH TURNING OF STAINLESS STEELS

(75) Inventors: Erik Sundstrom, Fagersta (SE); Stefan Ostlund, Fagersta (SE); Jenni Zackrisson, Fagersta (SE)

(73) Assignee: Seco Tools AB, Fagersta (SE)

( * ) Notice: Subject to any disclaimer, the term of this patent is extended or adjusted under 35 U.S.C. 154(b) by 182 days.

This patent is subject to a terminal disclaimer.

(21) Appl. No.: 12/525,199

(22) PCT Filed: Jan. 30, 2008

(86) PCT No.: PCT/SE2008/000085
§ 371 (c)(1),
(2), (4) Date: Dec. 15, 2009

(87) PCT Pub. No.: WO2008/094104
PCT Pub. Date: Aug. 7, 2008

(65) Prior Publication Data
US 2010/0139472 A1   Jun. 10, 2010

(30) Foreign Application Priority Data

Feb. 1, 2007   (SE) .................................... 07002710
Jul. 13, 2007  (SE) .................................... 07017031
Sep. 14, 2007  (SE) .................................... 07020522

(51) Int. Cl.
B32B 9/00 (2006.01)

(52) U.S. Cl. ............ 428/216; 51/307; 51/309; 407/119; 427/255.19; 427/255.21; 427/255.28; 428/336; 428/472; 428/697; 428/698; 428/701; 428/702

(58) Field of Classification Search .................... 51/307, 51/309; 428/216, 336, 472, 697, 698, 699, 428/701, 702; 427/255.19, 255.21, 255.2, 427/255, 8; 407/119
See application file for complete search history.

(56) References Cited

U.S. PATENT DOCUMENTS

| 5,250,367 | A  | * | 10/1993 | Santhanam et al. | ......... 428/472 |
| 6,333,100 | B1 | * | 12/2001 | Palmqvist et al. | ............ 428/701 |
| 7,132,153 | B2 | * | 11/2006 | Zackrisson et al. | ........... 428/336 |
| 2006/0188748 | A1 | * | 8/2006 | Kjellgren et al. | ............. 428/698 |
| 2007/0104945 | A1 | * | 5/2007 | Ruppi | .......................... 428/702 |

FOREIGN PATENT DOCUMENTS

JP   2004-299021   * 10/2004
* cited by examiner

Primary Examiner — Archene Turner
(74) Attorney, Agent, or Firm — Young & Thompson

(57) ABSTRACT

The present invention relates to a cutting tool insert comprising a cemented carbide body and a coating particularly useful in fine to medium-rough turning of stainless-steels. The cemented carbide body consists of a cemented carbide with a composition of 5.0-9.0 wt-% Co, 5.0-11.0 wt-% cubic carbide forming metals from group IVb, Vb and VIb of the periodic table, preferably Ti, Nb and Ta, and balance WC with a 10-30 μm essentially cubic carbide phase free and binder phase enriched surface zone. The coating comprises an MTCVD Ti(C7N) as the first layer adjacent the body having a thickness of from 2.5 to 7.0 μm, on top of which an α-Al₂O₃ layer is present, with a thickness of between 2.0 and 5.0 μm, and a total thickness of the coating between 5.5 and 9.5 μm. The alumina layer has a (006) texture.

20 Claims, 1 Drawing Sheet

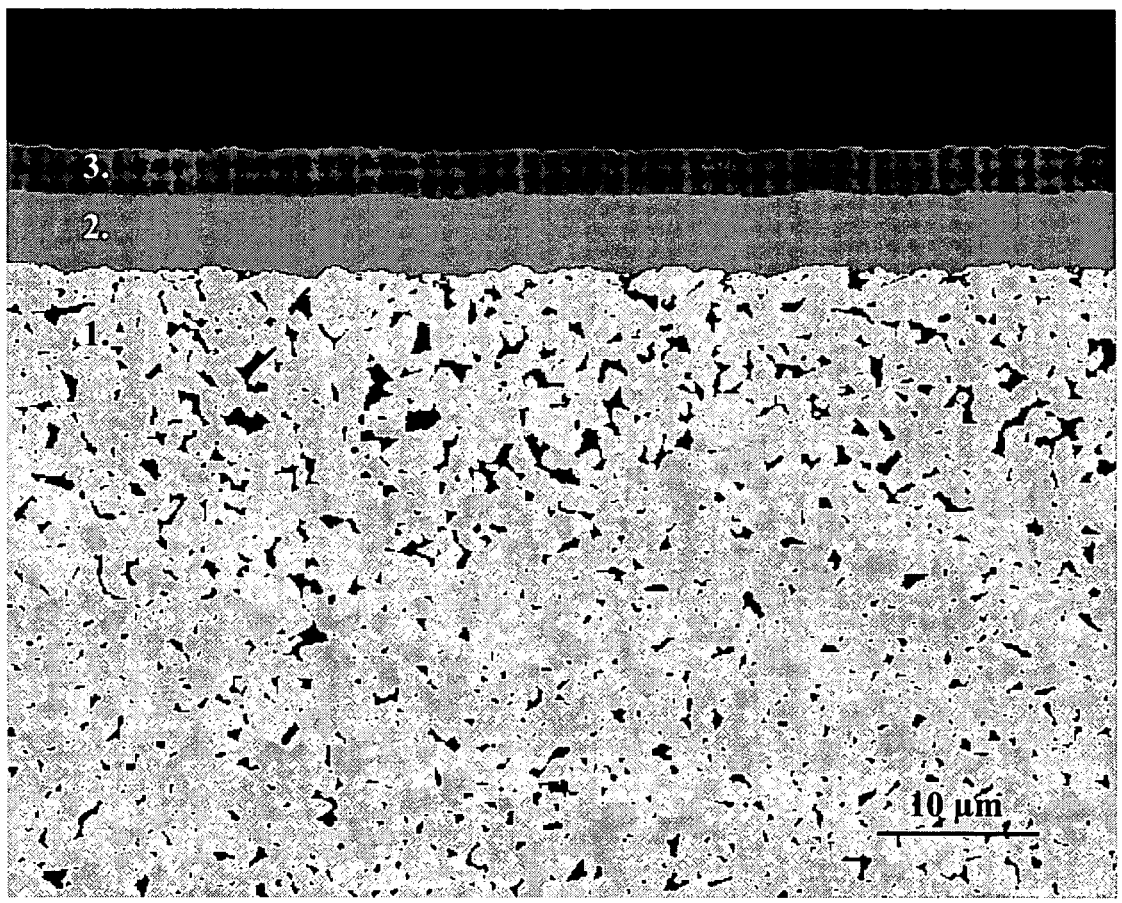

COATED CUTTING TOOL FOR FINE TO MEDIUM-ROUGH TURNING OF STAINLESS STEELS

BACKGROUND OF THE INVENTION

1. Field of the Invention

The present invention relates to a coated cutting tool insert designed to be used in fine to medium-rough turning stainless steels. The substrate is cemented carbide on which a hard and wear resistant coating is deposited. The said coating is composed of one or more refractory layers of which at least one layer is a strongly textured (006) alpha-alumina ($\alpha$-$Al_2O_3$).

2. Description of the Related Art

Steels are said to be stainless when they resist corrosion, or more properly when they are highly resistant to corrosion. The resistance to corrosion is achieved through dissolving sufficient chromium in the iron to produce a coherent, adherent, and regenerating chromium oxide protective film on the surface. A concentration of at least 11 wt-% Cr is required. Most of the stainless steels are based on the Fe—Cr—C and Fe—Cr—Ni—C systems, but other alloying elements are also important.

Stainless steels are used in harsh environments where high corrosion resistance is needed. Some stainless steels are also frequently used at elevated temperatures in severe environments due to their resistance to corrosion and the fact that they maintain their mechanical strength even at elevated temperatures. Stainless steels are among others used in automotive components, for chemical and food processing equipment, for surgical instruments and for cutlery and knives, where both aesthetic appearance and corrosion resistance are important design criteria.

When machining stainless steels toughness and wear resistance are important properties of the cutting tool. A tougher cutting tool will reduce the risk for chip hammering, chipping and notching. Wear resistance is needed to reduce the risk for plastic deformation, as the temperatures of the cutting edge will be high, a consequence of the poor heat conductivity of stainless steels. The wear resistance will also reduce abrasive wear, which will occur from hard aluminium oxide or carbide inclusions in the stainless steel as well as from work hardened surfaces created in previous cuts.

SUMMARY OF THE INVENTION

It is an object of the present invention to provide a grade with improved wear resistance and toughness dedicated for fine and medium-rough turning of stainless steels.

It was surprisingly noted that an $\alpha$-$Al_2O_3$ phase coating consisting of nucleated $\alpha$-$Al_2O_3$ with a strong (006) growth texture deposited on a Co-enriched cemented carbide substrate according to this invention gives improved wear resistance and toughness for fine to medium-rough turning of stainless steels.

BRIEF DESCRIPTION OF THE DRAWING FIGURE

FIG. 1 shows a light optical micrograph of a polished surface of a coated cemented carbide substrate according to the present invention in which
1. Cemented carbide body,
2. Single layer of Ti(C, N) and
3. Single layer of $Al_2O_3$.

DETAILED DESCRIPTION OF THE INVENTION

According to the present invention a coated cutting tool insert is provided consisting of a cemented carbide body with a composition of 5.0-9.0 wt-%, preferably 6.0-8.0 wt-%, most preferably 6.0-7.0 wt-% Co, and 5.0-11.0, preferably 6.5-9.5, wt-% cubic carbide forming metals from groups IVb, Vb and VIb of the periodic table, preferably Ti, Nb and Ta, and balance WC. The ratio between the weight concentrations of Ta and Nb is within 1.0-3.0, preferably 1.5-2.5. The ratio between the weight concentrations of Ti and Nb is within 0.5-1.5, preferably 0.8-1.2 with a coercivity (Hc) of 10.0-15.0, preferably 11.0-13.0 kA/m.

The cemented carbide is provided with a 10-30 μm thick, preferably 15-25 μm thick, essentially cubic carbide phase free and binder phase enriched surface zone with average binder phase content in the range 1.2-2.5 times the nominal binder phase content.

The coating comprises a MTCVD Ti(C,N) as the first layer adjacent the body having a thickness of from 2.5 to 7.0 μm, preferably from 3.5 to 5.0 μm. The MTCVD-layer consists of an innermost TiN layer of <1.0 preferably below 0.5 μm adjacent to the substrate with a Ti(C,N) layer on top. Preferably there is also an additional intermediate TiN layer on top of the Ti(C,N) layer, having a thickness of about 0.3-1.0 μm, preferably 0.5-0.8 μm. On top of the intermediate TiN layer an $\alpha$-$Al_2O_3$ layer is deposited. It is composed of columnar grains with a strong (006) texture. The thickness of the alumina layer is between 2.0 and 5.0 μm, preferably 2.5 and 4.0 μm. The total thickness of the coating comprising the Ti(C, N) and $\alpha$-$Al_2O_3$ layer is between 5.5 and 9.5 μm, preferably 6.5 and 8.5 μm.

The texture coefficients (TC) for the $\alpha$-$Al_2O_3$ layer is determined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=intensity of the (hkl) reflection,
Io(hkl)=standard intensity according to JCPDS card no 46-1212 and
n=number of reflections used in the calculation. (hkl) reflections used are: (012), (104), (110), (006), (113), (202), (024) and (116).
The texture of the alumina layer is as follows: TC(006)>2.0, preferably larger than 3. Simultaneously, TC(012), TC(110), TC(113), TC(202), TC(024) and TC(116) are all <1 and TC(104) is the second highest texture coefficient. In a preferred embodiment TC(104) is between 0.5 and 2.0.

The (006)-textured $\alpha$-$Al_2O_3$ layer is the outermost layer and the surface of the $\alpha$-$Al_2O_3$ is wet-blasted. The surface roughness is Ra=0.5-1.0 preferably 0.5-0.7 μm.

The invention also relates to methods of making cutting tool inserts comprising a cemented carbide substrate consisting of a binder phase of Co, WC and a cubic carbonitride phase with a binder phase enriched surface zone essentially free of cubic phase and a coating. A powder mixture containing 5-9, preferably 6-8 wt-%, most preferably 6.0-7.0 wt-% Co, and 5-11, preferably 6.5-9.5, wt-% cubic carbide forming metals from groups IVb, Vb and VIb of the periodic table, preferably Ti, Nb and Ta, and balance WC. The ratio between the weight concentrations of Ta and Nb is within 1.0-3.0, preferably 1.5-2.5. The ratio between the weight concentrations of Ti and Nb is within 0.5-1.5, preferably 0.8-1.2. Well-controlled amounts of nitrogen are added through the powder e.g. as nitrides or by performing an in-situ nitriding in the furnace using e.g. nitrogen gas. The optimum amount of nitrogen to be added depends on the composition of the cemented carbide and in particular on the amount of cubic was controlled by the deposition time. The thickness layer and texture coefficient for the layer is shown in table 1.

TABLE 1

| Thickness and texture coefficients of the layer | | | | | | | | | |
|---|---|---|---|---|---|---|---|---|---|
| TiCN, µm | α-Al$_2$O$_3$, µm | TC (012) | TC (104) | TC (110) | TC (006) | TC (113) | TC (202) | TC (024) | TC (116) |
| 4.3 | 3.2 | 0.37 | 1.32 | 0.30 | 4.57 | 0.20 | 0.41 | 0.19 | 0.65 | phases. The exact conditions depend to a certain extent on the design of the sintering equipment being used. It is within the purview of the skilled artisan to determine and to modify the nitrogen addition and the sintering process in accordance with the present specification in order to obtain the desired results.

The raw materials are mixed with pressing agent. The mixture is milled and spray dried to obtain a powder material with the desired properties. Next, the powder material is compacted and sintered. Sintering is performed at a temperature of 1300-1500° C., in a controlled atmosphere of about 50 mbar followed by cooling.

After conventional post sintering treatments including edge honing the cemented carbide surface is coated with a Ti(C,N) layer and possibly intermediate layers by CVD and/or MTCVD. Subsequently, a CVD process incorporating several different deposition steps is used to nucleate α-Al$_2$O$_3$ at a temperature of 1000° C. In these steps the composition of a CO$_2$+CO+H$_2$+N$_2$ gas mixture is controlled to result in an O-potential required to achieve (006) texture. The α-Al$_2$O$_3$-layer is then deposited by conventional CVD at 1000° C. The exact conditions depend on the design of the coating equipment being used. It is within the purview of the skilled artisan to determine the gas mixture in accordance with the present invention.

Finally, the α-Al$_2$O$_3$ is post treated with wet-blasting, in order to decrease the surface roughness.

The present invention also relates to the use of inserts according to the above for wet or dry fine to medium-rough turning of stainless steels, at a cutting speed of 120-275 m/min, a cutting depth 0.5-4.5 mm and a feed of 0.1-0.45 mm/rev.

Example 1

Cemented carbide inserts were produced according to the invention by conventional milling of the raw material powders, pressing of the green compacts and subsequent sintering at 1430° C. The inserts were also subjected to traditional edge preparation and dimensional grinding. The composition was 6.6 wt % Co, 3.6 wt % TaC, 2.2 wt % NbC, 2.5 wt % TiC and balance WC. The nitrogen was added to the carbide powder as Ti(C, N). The microstructural investigation after sintering showed that a cubic carbide free zone with a thickness of about 20 µm was formed. The coercivity was 11.8 kA/m, corresponding to an average grain size of about 1 µm.

Example 2

Inserts from Example 1 were coated by MTCVD. The first layer was Ti(C,N) deposited by MTCVD using acetonitrile as a carbon/nitrogen source. In the following steps an alumina layer was deposited and the composition of CO$_2$+CO+H$_2$+N$_2$ gas mixture was controlled to result in an O-potential required to achieve (006) texture. The thickness of the different layers Example 3

Inserts from example 1 and example 2 and a competitor grade (prior art) relevant to the application area were tested with respect to tool-life.
Work piece: Flange
Material: AISI316L forged, stainless steel
Insert type: CNMG120412-MF4
Cutting speed: 230 m/min
Feed: 0.25 mm/rev
Depth of cut: 1.5-2.0 mm
Remarks: Coolant
The tool-life criterion was 0.3 mm flank wear. Table 2 shows the number of machined parts per insert.

TABLE 2

| Tool-life | |
|---|---|
| Insert | Machined parts |
| Invention | 30 |
| Competitor 1 | 23 |
| Competitor 2 | 18 |

Example 4

Inserts from example 1 and example 2 and a competitor grade (prior art) relevant to the application area were tested with respect to tool-life.
Work piece: Component
Material: AISI304 forged, stainless steel
Insert type: CNMG120408-MF1
Cutting speed: 180, 200 m/min
Feed: 0.25 mm/rev
Depth of cut: 1.0-1.5 mm
Remarks: Coolant
The tool-life criterion was 0.2 mm flank wear. Table 3 shows the number of machined parts per insert.

TABLE 3

| Tool-life | | |
|---|---|---|
| Insert | Machined parts (180 m/min) | Machined parts (200 m/min) |
| Invention | 52 | 65 |
| Competitor 1 | 36 | 17 |

Example 5

Inserts from example 1 and example 2 and a competitor grade (prior art) relevant to the application area were tested with respect to tool-life.

Work piece: Tube
Material: AISI304 cast, stainless steel
Insert type: CNMG120412-MR3
Cutting speed: 150, 180 m/min
Feed: 0.35 mm/rev
Depth of cut: 2.0 mm
Remarks: Dry Table 4 shows the maximum cutting speed possible producing parts per insert. The tool-life criterion was surface finish.

TABLE 4

| | Tool-life |
|---|---|
| Insert | Cutting speed 15 parts |
| Invention | 180 m/min |
| Competitor 1 | 150 m/min |

Example 6

Inserts from example 1 and example 2 and a competitor grade (prior art) relevant to the application area were tested with respect to tool-life.

Work piece: Tube
Material: AISI S31803 forged, pre machined, stainless steel
Insert type: CNMG120412-MR3
Cutting speed: 120 m/min
Feed: 0.30 mm/rev
Depth of cut: 1.0 mm
Remarks: Coolant Table 5 shows the maximum cutting speed possible producing 15 parts per insert. The tool-life criterion was surface finish.

TABLE 5

| | Tool-life |
|---|---|
| Insert | Number of machined parts |
| Invention | 25 |
| Competitor 1 | 16 |

Examples 3-6 show that the inserts according to the invention offer an increased tool-life and increased productivity.

The invention claimed is:

1. A cutting tool insert, comprising:
a cemented carbide body that comprises 5.0-9.0 wt-% Co, 5.0-11.0 wt-% cubic carbide forming metals selected from group IVb, Vb and VIb of the periodic table and balance WC, and with a weight-ratio of Ta and Nb, when present, between 1.0-3.0 and between Ti and Nb, when present, within 0.5-1.5 and with a coercivity (Hc) of 10.0-15.0 kA/m, whereby the cemented carbide is provided with a 10-30 μm, essentially cubic carbide phase free and binder phase enriched surface zone with average binder phase content in the range 1.2-2.5 times the nominal binder phase content; and
a coating that comprises a MTCVD Ti(C,N) as a first layer adjacent the body having a thickness of from 2.5 to 7.0 μm, where the MTCVD-layer comprises an innermost TiN layer adjacent to the body with a Ti(C,N) layer on top, optionally with an additional intermediate TiN layer on top of the Ti(C,N) layer, with a thickness of 0.3-1.0 μm on top of which an α-$Al_2O_3$ layer is present, with a thickness of between 2.0 and 5.0 μm and a total thickness of the coating between 5.5 and 9.5 μm, where the texture of the α-$Al_2O_3$ layer is TC(006)>2.0 and where the texture coefficients (TC) for the α-$Al_2O_3$ layer is determined as follows:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

where
I(hkl)=intensity of the (hkl) reflection,
$I_0$(hkl)=standard intensity according to JCPDS card no 46-1212, and
n=number of reflections used in the calculation, and the (hkl) reflections used are: (012), (104), (110), (006), (113), (202), (024) and (116), where TC(012), TC(110), TC(113), TC(202), TC(024) and TC(116) are all simultaneously <1 and TC(104) is the second highest texture coefficient with TC(104) between 0.5 and 2.0.

2. The cutting tool insert according to claim 1, wherein the surface of α-$Al_2O_3$ layer is wet-blasted, with roughness $R_a$=0.5-1.0 μm.

3. A method for making a cutting tool insert, comprising:
providing a substrate made by powder metallurgical methods milling, pressing and sintering with a cemented carbide substrate with a composition of 5.0-9.0 wt-% Co, 5.0-11.0 wt-% cubic carbide forming metals selected from group IVb, Vb and VIb of the periodic table, and balance WC, and with a weight-ratio of Ta and Nb, when present, between 1.0-3.0 and between Ti and Nb, when present, within 0.5-1.5, and with a coercivity (Hc) of 10.0-15.0 kA/m, whereby the cemented carbide is provided with a 10-30 μm essentially cubic carbide phase free and binder phase enriched surface zone with average binder phase content in the range 1.2-2.5 times the nominal binder phase content, and
depositing after post sintering treatments including edge honing the cemented carbide surface a Ti(C,N) layer and optional intermediate layers, if present, by CVD, MTCVD, and combinations thereof and subsequently using a CVD process incorporating several different deposition steps to nucleate α-$Al_2O_3$ at a temperature of 1000° C. in a $CO_2$+CO+$H_2$+$N_2$ gas mixture the composition of which is controlled to result in an O-potential required to achieve (006) texture and finally the α-$Al_2O_3$-layer by CVD at 1000° C.

4. A method for wet or dry fine or medium-rough turning of stainless steel, comprising cutting with a cutting tool insert of claim 1 at a cutting speed of 120-275 m/min, a cutting depth 0.5-4.5 mm and a feed of 0.1-0.45 mm/rev.

5. The cutting tool insert of claim 1,
wherein said cemented carbide body comprises 6.0-8.0 wt-% Co.

6. The cutting tool insert of claim 1,
wherein said cemented carbide body comprises 6.5-9.5 wt-% cubic carbide forming metals selected from group IVb, Vb and VIb of the periodic table.

7. The cutting tool insert of claim 1,
wherein said cubic carbide forming metals from group IVb, Vb and VIb of the periodic table are selected from the group consisting of Ti, Nb, Ta, and combinations thereof.

8. The cutting tool insert of claim 1,
wherein said weight-ratio of Ta and Nb is between 1.5-2.5.

9. The cutting tool insert of claim 1,
wherein said weight-ratio of Ti and Nb is between 0.8-1.2.

10. The cutting tool insert of claim 1,
wherein said coercivity (Hc) is 11.0-13.0 kA/m.

11. The cutting tool insert of claim 1,
wherein said cemented carbide is provided with a 15-25 μm essentially cubic carbide phase free and binder phase enriched surface zone with average binder phase content in the range 1.2-2.5 times the nominal binder phase content.

12. The cutting tool insert of claim 1,
wherein said coating comprising a MTCVD Ti(C,N) as the first layer adjacent the body having a thickness of from 3.5 to 5.0 μm.

13. The cutting tool insert of claim 1,
wherein said innermost TiN layer has a thickness below 0.5 μm.

14. The cutting tool insert of claim 1,
wherein said intermediate TiN layer on top of the Ti(C,N) layer has a thickness of 0.5-0.8 μm.

15. The cutting tool insert of claim 1,
wherein said α-$Al_2O_3$ layer has a thickness of between 2.5 and 4.0 μm.

16. The cutting tool insert of claim 1,
wherein said total thickness of the coating is between 6.5 and 8.5 μm.

17. The cutting tool insert of claim 1,
wherein said texture of the α-$Al_2O_3$ layer is TC(006)>3.

18. A cutting tool insert of claim 1,
wherein the surface of the α-$Al_2O_3$ layer is wet-blasted, with roughness $R_a$=0.5-0.7 μm.

19. A cutting tool insert, comprising:
a cemented carbide body comprising 5.0-9.0 wt-% Co, 5.0-11.0 wt-% cubic carbide forming metals selected from group IVb, Vb and VIb of the periodic table and balance WC, and with a weight-ratio of Ta and Nb, when present, between 1.0-3.0 and between Ti and Nb, when present, within 0.5-1.5 and with a coercivity (Hc) of 11.0-13.0 kA/m, and the cemented carbide is provided with a 10-30 μm, essentially cubic carbide phase free and binder phase enriched surface zone with average binder phase content in the range 1.2-2.5 times the nominal binder phase content; and a coating comprising a MTCVD Ti(C,N) as a first layer adjacent the body having a thickness of from 2.5 to 7.0 μm, where the MTCVD-layer comprises an innermost TiN layer adjacent to the body with a Ti(C,N) layer on top, optionally with an additional intermediate TiN layer on top of the Ti(C,N) layer, with a thickness of 0.3-1.0 μm on top of which an α-$Al_2O_3$ layer is present, with a thickness of between 2.0 and 5.0 μm and a total thickness of the coating between 5.5 and 9.5 μm, where the texture of the α-$Al_2O_3$ layer is TC(006)>3.0 and where the texture coefficients (TC) for the α-$Al_2O_3$ layer is determined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=intensity of the (hkl) reflection,
$I_0$(hkl)=standard intensity according to JCPDS card no 46-1212, and
n=number of reflections used in the calculation, and the (hkl) reflections used are: (012), (104), (110), (006), (113), (202), (024) and (116), where TC(012), TC(110), TC(113), TC(202), TC(024) and TC(116) are all simultaneously <1 and TC(104) is the second highest texture coefficient with TC(104) between 0.5 and 2.0.

20. The cutting tool insert of claim 1, wherein TC(006)=4.57 and TC(104)=1.32.

* * * * *